United States Patent
Pino

(10) Patent No.: US 7,902,857 B1
(45) Date of Patent: Mar. 8, 2011

(54) RECONFIGURABLE ELECTRONIC CIRCUIT

(75) Inventor: Robinson E. Pino, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 12/798,631

(22) Filed: Apr. 8, 2010

(51) Int. Cl.
*H03K 19/094* (2006.01)
*G06F 7/38* (2006.01)

(52) U.S. Cl. .............................................. 326/14; 326/49

(58) Field of Classification Search .................... 326/14, 326/52, 37, 49, 50
See application file for complete search history.

(56) References Cited

U.S. PATENT DOCUMENTS

2009/0097304 A1* 4/2009 Choi et al. ..................... 365/163

OTHER PUBLICATIONS

Yenpo Ho et al. "Nonvolatile Memristor Memory: Device Characteristics and Design Implications", Nov. 2-5, 2009, IEEE/ACM International Conference on Computer-Aided Design Digest of Technical Papers, pp. 485-490.*

* cited by examiner

*Primary Examiner* — Daniel D Chang
(74) *Attorney, Agent, or Firm* — Joseph A. Mancini

(57) ABSTRACT

An apparatus and method provides the foundation for designing reconfigurable electronic computing systems. The invention relies on an ability to change the resistance state of a memristor device to achieve an optimal voltage at specific circuit nodes, whereby this dynamically and autonomously causes the circuit to reconfigure itself and produce a different output for the same input relative to the circuit's initial state. The circuit's state remains constant until the memristor's resistance is changed, at which point the circuit's function is "reprogrammed".

17 Claims, 3 Drawing Sheets

US 7,902,857 B1

RECONFIGURABLE ELECTRONIC CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates generally to the field of electronic circuit design. More specifically, this invention relates to electronic circuits which have a reprogrammable function.

Current, conventional digital computing architectures rely solely on the field effect transistor (FET) which is a four terminal device (drain, gate, source, and body). However, during operation for storing or retrieving information the FET device needs to be powered continuously. In addition, high charge leakage issues in the device require continuous refreshing of the processed information during standby and operation. This continuous need for power creates limitations on the system's power consumption and form factor scale.

One potential solution for computing architectures that eliminates the need for constant refreshing may lie within the realm of non-volatile, passive devices. One such device is the memristor, a non-volatile passive electronic device which only consumes power during operation and reconfiguration. To the extent only that memristors are not available is the reason why passive reconfigurable electronics are not available today. The fact that the memristor is a nonvolatile memory device could eventually mean that any standby power utilization of computing systems will be minimized or altogether eliminated.

The memristor device postulated in 1971 by Leon Chua [1] as the fourth basic circuit element has received much attention in the research community since the publication of Strukov's 2008 paper titled "The missing memristor found" [5]. The memristor name is a contraction for memory resistor [1] because that is exactly its function: to remember its history [3]. The memristor is a two terminal passive device whose resistance state depends on its previous state and present electrical biasing conditions, and combined with transistors in a hybrid chip, memristors could radically improve the performance of digital circuits without the necessity to shrink transistors [3]. Given their two terminal structural simplicity and electronic passivity, the applications for memristor technology range from non-volatile memory, instant on computers, reconfigurable electronics and neuromorphic computing [4],[3]. According to Chua [4], the memristor behaves like a linear resistor with memory.

What is lacking in the prior art, however, is the method and/or means by which passive memory devices such as memristors can be adapted to computing circuits so as to render the latter reconfigurable and eliminate the need for standby power consumption to maintain the reconfigured state.

OBJECTS AND SUMMARY OF THE INVENTION

It is an object of the present invention to provide a method and apparatus that permits extremely low power consumption computing architectures by eliminating the need for refreshing the state of a computer processor or memory.

It is another object of the present invention, then, to provide a method and apparatus that provides for electronic circuitry having both a reconfigurable and non-volatile state.

Briefly stated, the present invention provides an apparatus and method as a fundamental building block for the designing of reconfigurable electronic computing systems. The invention relies on an ability to change the resistance state of a memristor device to achieve an optimal voltage at specific circuit nodes, whereby this dynamically and autonomously causes the circuit to reconfigure itself and produce a different output for the same input relative to the circuit's initial state. The circuit's state remains constant until the memristor's resistance is changed, at which point the circuit's function is "reprogrammed".

The above, and other objects, features and advantages of the present invention will become apparent from the following description read in conjunction with the accompanying drawings, in which like reference numerals designate the same elements.

REFERENCES

[1] (Chua 1971) L. Chua, "Memristor—The Missing Circuit Element," IEEE Transactions on Circuits Theory (IEEE) 18 (5) (1971) 507-519.
[2] R. Pino and J. W. Bohl, "Simple Compact Method for Modeling and Simulation of Chalcogenide Based Memristor Devices," Invention Disclosure, December 2009.
[3] (Williams 2008) R. Stanley Williams, "How We Found the Missing Memristor," IEEE Spectrum, vol 45 (12) (2008) p 28-35.
[4] (Chua 1976) L. Chua and S. M. Kang, "Memristive Device and Systems," Proceedings of IEEE Vol 64 (2) (1976) p 209-223.
[5] (Strukov 2009) Dmitri B. Strukov, Gregory S. Snider, Duncan R. Stewart and R. Stanley Williams, "The missing memristor found," Nature vol 453 (2008) p 80-83.
[6] U.S. patent application Ser. No. 12/657,262, entitled "Method and Apparatus for Modeling Memristor Devices", by Robinson Pino, et al, filed Jan. 6, 2010.

DETAILED DESCRIPTION OF THE PREFERRED EMBODIMENT

The present invention provides an apparatus and method for reprogrammable electronic circuit. The present invention employs a memristor-based approach within an innovative CMOS circuit biasing architecture to achieve autonomous electronic reconfigurability or reprogramming ability from a determined desired output and input signals. Simulation results performed on a hybrid CMOS and memristor device circuit demonstrate that a hardware realization of such electronic reconfigurable or reprogrammable system employing chalcogenide-based memristors and existing CMOS technologies is possible. The present invention represents the primitive building block for high density, small form-factor, and ultra-low power computing architectures.

The present invention leverages recent technological advances and discoveries namely the nonvolatile memory resistor device or "memristor" for short [1] and recent inventions in memristor modeling methodology [2], [6].

An important challenge in working with memristor devices is the modeling of the time-domain hysteresis electronic behavior. Thus, no large scale or accurate circuit simulations can be performed since behavioral models do not exist. However, a recently developed invention provides a compact model and method for modeling and simulating memristor devices [2], [6]. The compact model developed models the electronic time and voltage domain characteristic behavior of chalcogenide-based memristor devices. This model, the first of its kind, enables the accurate modeling and simulation of memristor-based reprogrammable electronic circuits. Accordingly, the disclosure of the present invention incorporates by reference the disclosure of U.S. patent application Ser. No. 12/657,262, entitled "Method and Apparatus for Modeling Memristor Devices", by Robinson Pino, et al, filed Jan. 6, 2010.

Figure 1:
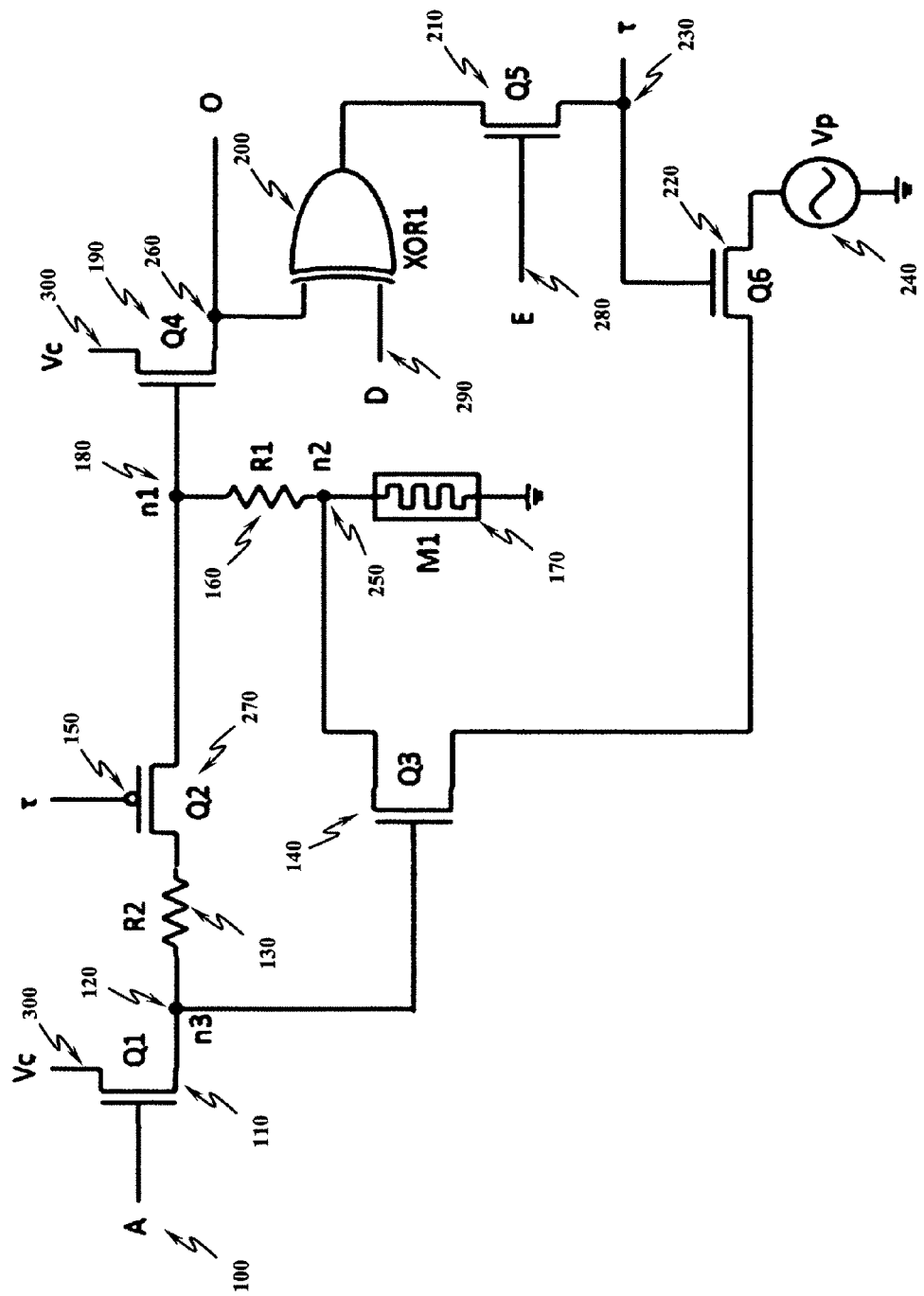
FIG. 1 depicts a schematic of a reconfigurable electronic circuit based on a memristor.

Referring to FIG. 1 depicts the reconfigurable electronic circuit schematic of the present invention. From the circuit schematic, Q1 110 and Q4 190 represent thresholding gates (nFET transistors) whose output is directly proportional to the voltage applied to the gate node respectively. During our simulation, we assume the threshold voltage of Q1 110 and Q4 190 are 100 mV. The resistors R1 160 and R2 130 are biasing resistors to obtain the appropriate voltage biasing conditions to control the signal strength at the gate node, n1 180, of transistor Q4 190. Thus, the voltage at node n1 180 is given by $$V(n1) = Vc\left(\frac{R1 + M1}{R1 + R2 + M1}\right) \quad (1)$$

where Vc 300 is the voltage at the drain node of nfet transistor Q1 110, R1 160 and R2 130 are regular resistors, and M1 is the resistance state of the memristor device 170. This is a first order calculation ignoring any parasitic additional resistance, capacitance, and inductance effects. Thus, if the resistance state of M1 170 is high V(n1), the voltage at node n1 180, will be high and if M1 170 is low, V(n1) will be low. The input signal A 100 represents the input signal to transistor Q1 110 which if greater than the threshold voltage (100 mV) will cause Q1 110 to output Vc 300, connected its drain node. Otherwise, if the input signal A 100 is lower than 100 mV, then the output of Q1 110 will be low or 0V. The transistor Q2 270 is a safe gate (pFet transistor with threshold voltage of 0V) which prevents any perturbation to the memristor device M1 170 whenever the T150 node is greater than 0V. The voltage source Vp 240 corresponds to the reconfiguring pulse signal voltage used to reprogram M1 170 (the memristor) based on the electrical device characteristics described elsewhere [2]. The D node 290 is the desired output that we want the circuit to be and it is used to initiate the circuit reconfiguration process. The XOR1 logic gate 200 compares the circuit's output O 260 to the desired output D 290 and whenever D 290 and O 260 are different the output of XOR1 will be 1 otherwise it will be 0 given its standard Boolean logic functionality. The output of XOR1 200 is defined at the Tnode 230. The node E 280 is the programming enable mechanism that whenever greater than Q5's 210 threshold voltage (100 mV), it will connect the output of XOR1 200, T node 230, to the gate of Q6 220. Anytime nodes T230 and E 280 are greater then 100 mV, the reconfiguring pulse Vp 240 will be allowed into the circuit to reconfigure or reprogram the M1 170 the memristor device as determined by its electronic characteristics [2]. The transistor Q3 140 is a safe gate (100 mV threshold voltage) that prevents the reconfiguring pulse Vp 240 to perturb the memristor M1 170 whenever the input signal A 100 is zero.

Simulation Results

Figure 2:
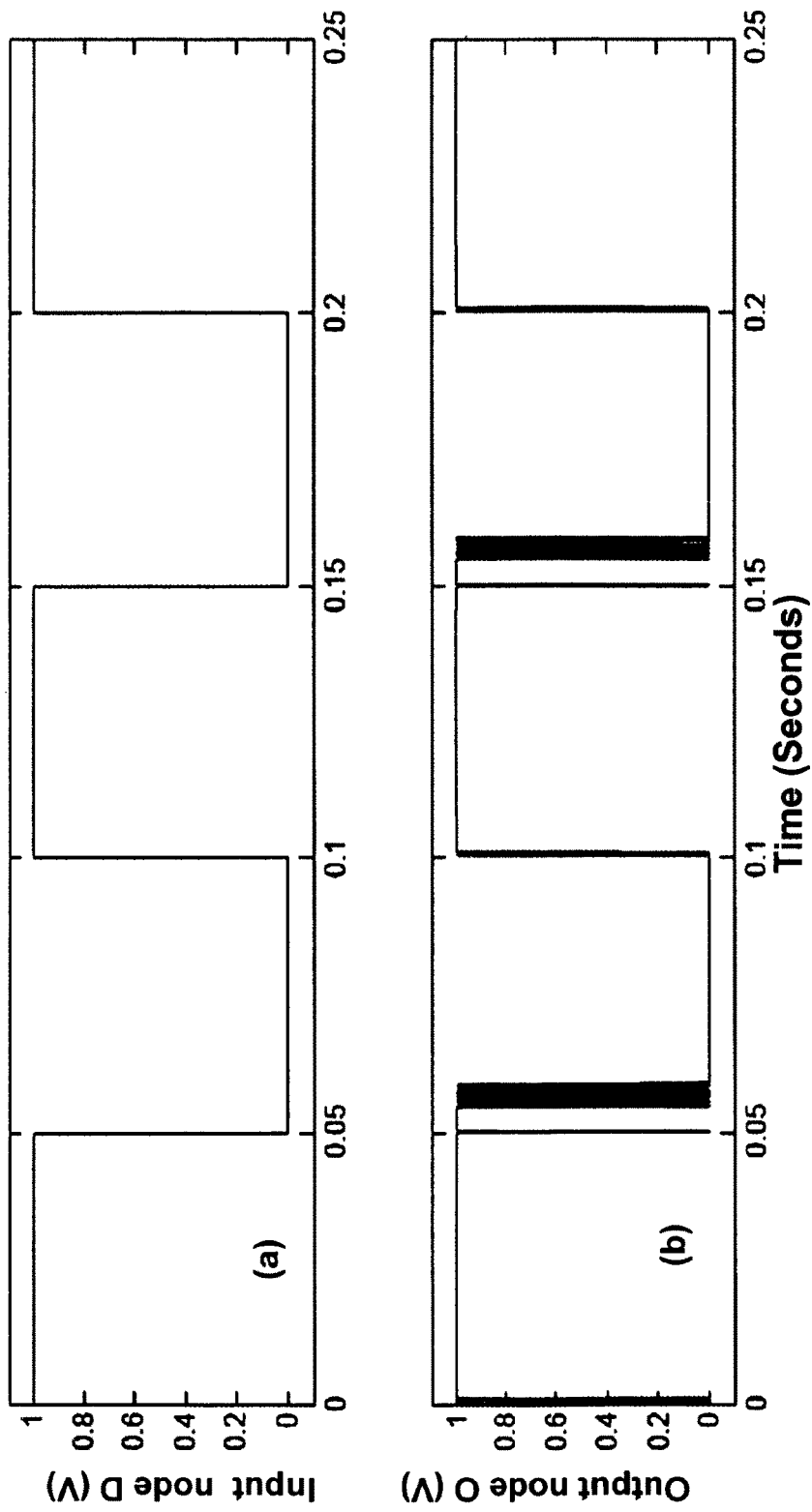
FIG. 2a depicts the simulation results and reconfigurability properties of the reconfigurable circuit of FIG. 1, specifically the input voltage at node D.
FIG. 2b depicts the simulation results and reconfigurability properties of the reconfigurable circuit of FIG. 1, specifically, the output pattern of the reconfigurable circuit at node O.

Referring to FIG. 2 displays the simulation results and reconfigurability properties of our reconfigurable circuit. To simulate the operation of the circuit, we employed the compact model for chalcogenide-based memristor described elsewhere [2]. FIG. 2a, the top pattern, corresponds to the input voltage at node D (290, FIG. 1), and FIG. 2b corresponds to the output pattern of the reconfigurable circuit at node O (260, FIG. 1). During this particular simulation results nodes A (100, FIG. 1) and E (280, FIG. 1) were set to high (1V). From the results we, can observe how the circuit's output node O (260, FIG. 1) follows the desired training input D (290, FIG. 1). The figure also shows that during the transition points from high to low and low to high outputs, the circuit oscillates until autonomous reconfigurability of the memristor M1(170, FIG. 1) is achieved to obtain the appropriate voltage at node n1 (180, FIG. 1) to cause the output of Q4 (190, FIG. 1) to be either high (Vc) or low (0V).

Figure 3:
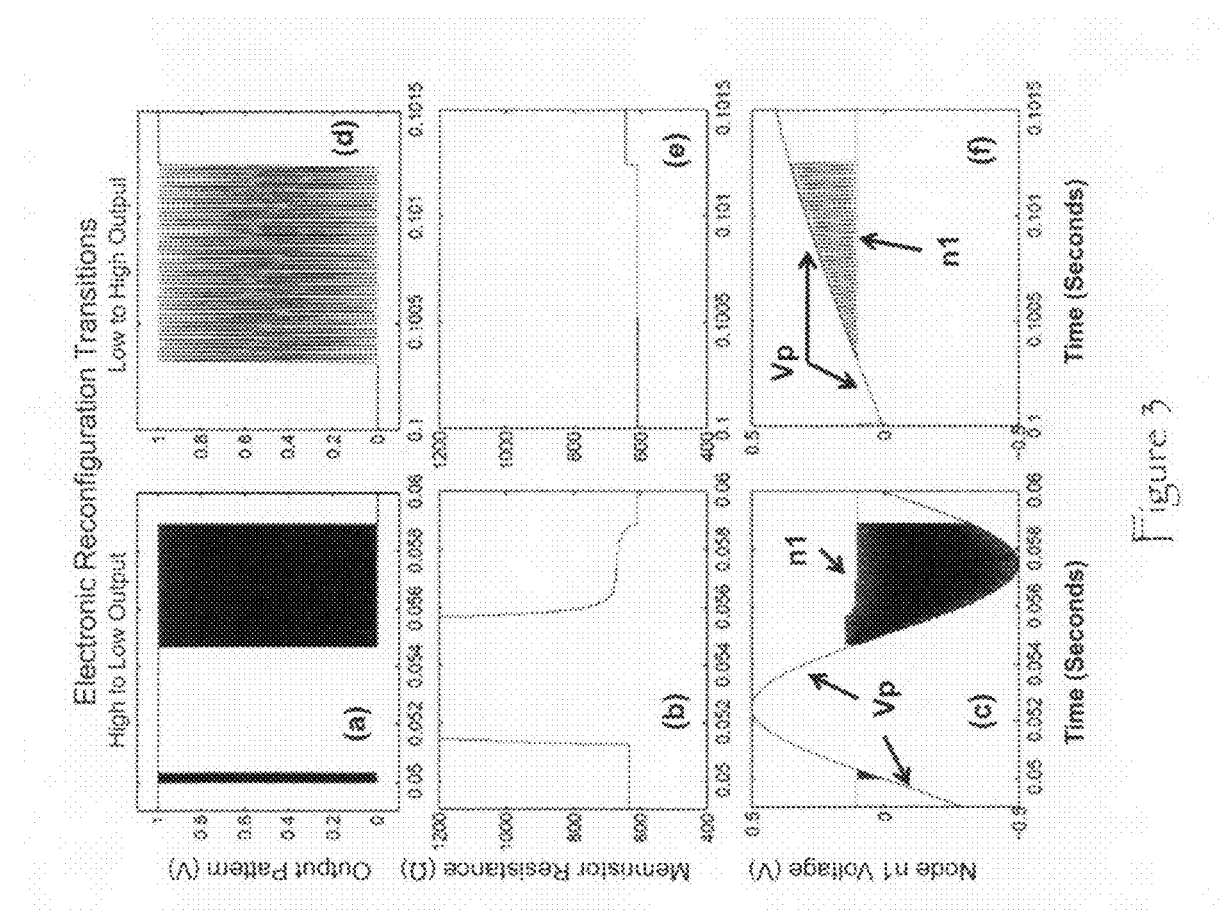
FIG. 3a depicts the transition points of the reconfigurable circuit of FIG. 1, specifically, the output voltage transition from high to low.
FIG. 3b depicts the transition points of the reconfigurable circuit of FIG. 1, specifically, the change in memristor resistance over time corresponding to an output voltage transition from high to low.
FIG. 3c depict the voltage oscillations at node n1 and the Vp reconfiguring pulse enveloping the oscillating n1 node voltage corresponding to an output voltage transition from high to low.
FIG. 3d depicts the transitions points of the reconfigurable circuit of FIG. 1, specifically, the output voltage transition from low to high.
FIG. 3e depicts the transitions points of the reconfigurable circuit of FIG. 1, specifically, the change in memristor resistance over time corresponding to an output voltage transition from low to high.
FIG. 3f depicts the voltage oscillations at node n1 and the Vp reconfiguring pulse enveloping the oscillating n1 node voltage corresponding to an output voltage transition from low to high.

Referring to FIG. 3 describes in detail the electronic reconfigurable circuit transition points from high to low output FIGS. 3a, 3b, and 3c and low to high output FIGS. 3d, 3e, and 3f transitions. FIGS. 3a and 3d show the voltage transition oscillations, FIGS. 3b and 3e show the change in the memristor M1(170, FIG. 1) resistance change overtime, and FIGS. 3c and 3f show the voltage oscillations at node n1 (180, FIG. 1) and the Vp (240, FIG. 1) reconfiguring pulse enveloping the oscillating n1 (180, FIG. 1) node voltage. In addition, the results, FIGS. 3b and 3e, show how the memristor device, M1(170, FIG. 1), resistance state changes during reconfiguration (along with the memristor effective reconfiguring or "biasing" voltage Vp in FIGS. 3c and 3f until the appropriate value is autonomously obtained by the reconfigurable circuit. Once the circuit output, O (260, FIG. 1), matches the desired input value, D (290, FIG. 1), the output of the XOR1 logic gate (200, FIG. 1) will be zero and the path of the training pulse, Vp (240, FIG. 1), will be blocked (meaning transistor Q6 (220, FIG. 1) will be in the off state), stopping the reconfiguration process.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A reconfigurable electronic circuit, comprising:
an input;
an output;
a voltage divider network comprising at least one fixed resistance and at least one programmable resistance;
an input gate for preventing the actuation of said reconfigurable electronic circuit for input signals below a specified voltage;
a means for generating a reconfiguring pulse to reprogram said programmable resistances;
a first safe gate for preventing perturbation to said programmable resistances unless said first safe gate means is triggered;
a logic circuit having a first logic input, a second logic input; and a logic output,
wherein said first logic input of said logic circuit is electrically connected to said output of said reconfigurable electronic circuit, and
wherein said second logic input of said logic circuit is used to initiate the reconfiguration of said reconfigurable electronic circuit;
a programming enable gate coupled to said logic output;
a second safe gate for permitting the programming of said programmable resistances when said input of said reconfigurable electronic circuit is at a specified level, and preventing the programming of said programmable resistances otherwise;
means for preventing a DC offset to said means for generating a reconfiguring pulse; and
an output gate, in cooperation with said voltage divider network, for switching said output of said reconfigurable electronic circuit to either of two predetermined voltage states.

2. The reconfigurable electronic circuit of claim 1, wherein said at least one programmable resistance comprises a memristor.

3. The reconfigurable electronic circuit of claim 1, wherein said first safe gate further comprises an inverting input.

4. The reconfigurable electronic circuit of claim 1, wherein all said gates comprise field effect transistors (FETs).

5. The reconfigurable electronic circuit of claim 3, wherein said first safe gate comprises a p-channel field effect transistor (pFET).

6. The reconfigurable electronic circuit of claim 1, wherein said logic circuit comprises an exclusive OR (XOR) logic gate.

7. A reconfigurable electronic circuit comprising:
an input terminal;
a first gate;
a first resistance having a first terminal and a second terminal;
a second gate;
a third gate;
a second resistance having a first terminal and a second terminal;
a programmable resistance having a first terminal and a second terminal;
a fourth gate;
an output terminal;
a logic gate having a first logic input, a second logic input, and a logic output;
a desired output terminal;
a programming enable terminal;
a fifth gate;
a sixth gate; and
a means for generating a reconfiguring pulse;
wherein said gates are field effect transistors (FET) each having a gate terminal, source terminal, and drain terminal;
wherein said second gate is a p-channel field effect transistor (pFET); and
wherein said input terminal is connected to said gate terminal of said first gate; said drain terminal of said first gate is connected to a control voltage; said source terminal of said first gate is connected to said gate terminal of said third gate and said first terminal of said first resistance; said second terminal of said first resistance is connected to said drain terminal of said second gate; said source terminal of said second gate is connected to said first terminal of said second resistance and said gate terminal of said fourth gate; said second terminal of said second resistance is connected to said first terminal of said programmable resistance and said drain terminal of said third gate; said second terminal of said programmable resistance is connected to a fixed potential; said drain terminal of said fourth gate is connected to a control voltage; said source terminal of said fourth gate is connected to said output terminal and said first logic input of said logic gate; said desired output terminal is connected to said second logic input of said logic gate; said output of said logic gate is connected to said drain terminal of said fifth gate; said programming enable terminal is connected to said gate terminal of said fifth gate; said source terminal of said fifth gate is connected to said gate terminal of said second gate and said gate terminal of said sixth gate; said drain terminal of said sixth gate is connected to said means for generating a reconfiguring pulse; and said source terminal of said sixth gate is connected to said source terminal of said third gate.

8. The reconfigurable electronic circuit of claim 7, wherein said programmable resistance is a memristor.

9. The reconfigurable electronic circuit of claim 7, wherein said logic gate is an exclusive OR (XOR) logic gate.

10. A method for reconfiguring a circuit, comprising the steps of:
applying a control voltage across a voltage divider network wherein at least one resistance element of said voltage divider network comprises a programmable resistance;
when a voltage from a node in said voltage divider network reaches a predetermined level, then logically comparing a control voltage to a desired circuit output;
when said control voltage is logically different from said desired circuit output, apply a reprogramming voltage across said programmable resistance so as to reconfigure said reconfigurable electronic circuit.

11. The method for reconfiguring a circuit of claim 10, further comprising the step of gating the result of said logical comparison so as to prevent said reprogramming voltage from being applied across said reprogrammable resistance unless enabled.

12. The method for reconfiguring a circuit of claim 10, further comprising the step of gating said control voltage with an input signal so as to prevent said control voltage from being applied across said voltage divider network unless said input voltage exceeds a predetermined voltage.

13. The method for reconfiguring a circuit of claim 12, further comprising the step of gating the control voltage across said programmable resistance so as to prevent perturbation to said programmable resistance even when said control voltage is applied across said voltage divider network.

14. The method for reconfiguring a circuit of claim 10, further comprising the step of gating said reprogramming voltage so as to prevent the possibility of said reprogramming voltage being applied to said programmable resistance when said input signal is below a predetermined level.

15. The method for reconfiguring a circuit of claim 11, further comprising the step of gating the output of said logical comparison so as to prevent said reprogramming voltage from being applied across said reconfigurable resistance even when enabled.

16. The method of claim 10, wherein said programmable resistance is a memristor.

17. The method of claim 10, wherein said logical comparison is an exclusive OR (XOR) comparison.

* * * * *